(12) United States Patent
Kowalik-Seidl et al.

(10) Patent No.: US 10,374,056 B2
(45) Date of Patent: Aug. 6, 2019

(54) LATCH-UP RESISTANT TRANSISTOR

(71) Applicant: Infineon Technologies Austria AG, Villach (AT)

(72) Inventors: Katarzyna Kowalik-Seidl, Munich (DE); Bjoern Fischer, Munich (DE); Winfried Kaindl, Unterhaching (DE); Markus Schmitt, Neubiberg (DE); Matthias Wegscheider, Villach (AT)

(73) Assignee: Infineon Technologies Austria AG, Villach (AT)

( * ) Notice: Subject to any disclaimer, the term of this patent is extended or adjusted under 35 U.S.C. 154(b) by 18 days.

(21) Appl. No.: 15/337,829

(22) Filed: Oct. 28, 2016

(65) Prior Publication Data

US 2017/0125580 A1 May 4, 2017

(30) Foreign Application Priority Data

Oct. 30, 2015 (DE) ........................ 10 2015 118 616

(51) Int. Cl.
| | |
|---|---|
| *H01L 29/78* | (2006.01) |
| *H01L 29/66* | (2006.01) |
| *H01L 21/265* | (2006.01) |
| *H01L 29/06* | (2006.01) |
| *H01L 29/739* | (2006.01) |
| *H01L 29/08* | (2006.01) |

(Continued)

(52) U.S. Cl.
CPC .. *H01L 29/66333* (2013.01); *H01L 21/26586* (2013.01); *H01L 29/0634* (2013.01); *H01L 29/66719* (2013.01); *H01L 29/66727* (2013.01); *H01L 29/7395* (2013.01); *H01L 21/2253* (2013.01); *H01L 29/0696* (2013.01); *H01L 29/0865* (2013.01); *H01L 29/1095* (2013.01)

(58) Field of Classification Search
CPC ............ H01L 29/7811; H01L 29/1095; H01L 21/2253
See application file for complete search history.

(56) References Cited

U.S. PATENT DOCUMENTS

| | | | | |
|---|---|---|---|---|
| 4,613,882 A | * | 9/1986 | Pimbley | H01L 29/78 257/336 |
| 5,409,848 A | * | 4/1995 | Han | H01L 21/26586 148/DIG. 18 |

(Continued)

FOREIGN PATENT DOCUMENTS

| | | |
|---|---|---|
| DE | 10353772 A1 | 6/2005 |
| KR | 1020080015863 A | 2/2008 |

(Continued)

*Primary Examiner* — Tucker J Wright
*Assistant Examiner* — Wilner Jean Baptiste
(74) *Attorney, Agent, or Firm* — Murphy, Bilak & Homiller, PLLC

(57) ABSTRACT

Disclosed is a method for producing a transistor device and a transistor device. The method includes: forming a source region of a first doping type in a body region of a second doping type in a semiconductor body; and forming a low-resistance region of the second doping type adjoining the source region in the body region. Forming the source region includes implanting dopant particles of the first doping type using an implantation mask via a first surface of the semiconductor body into the body region. Implanting the doping particles of the first doping type includes a tilted implantation.

20 Claims, 6 Drawing Sheets

(51) Int. Cl.
*H01L 29/10* (2006.01)
*H01L 21/225* (2006.01)

(56) References Cited

U.S. PATENT DOCUMENTS

| | | | |
|---|---|---|---|
| 6,140,679 A | 10/2000 | Feria et al. | |
| 6,555,872 B1* | 4/2003 | Dennen | H01L 29/4236 257/327 |
| 7,566,624 B2 | 7/2009 | Leitner et al. | |
| 2003/0060014 A1 | 3/2003 | Neidhart et al. | |
| 2005/0095804 A1* | 5/2005 | Dietz | H01L 21/2253 438/414 |
| 2006/0007727 A1* | 1/2006 | Harrison | G11C 16/04 365/147 |
| 2006/0267088 A1* | 11/2006 | Sharp | H01L 29/66727 257/341 |
| 2007/0170517 A1* | 7/2007 | Furukawa | H01L 21/76237 257/372 |
| 2012/0305993 A1* | 12/2012 | Willmeroth | H01L 27/088 257/262 |
| 2012/0306003 A1* | 12/2012 | Willmeroth | H01L 29/0634 257/329 |
| 2014/0070315 A1* | 3/2014 | Levy | H01L 29/0634 257/343 |
| 2014/0306284 A1* | 10/2014 | Mauder | H01L 29/105 257/330 |
| 2016/0064478 A1* | 3/2016 | Sun | H01L 29/0634 257/329 |

FOREIGN PATENT DOCUMENTS

| | | |
|---|---|---|
| KR | 1020080034003 A | 4/2008 |
| WO | 02099909 A1 | 12/2002 |

* cited by examiner

LATCH-UP RESISTANT TRANSISTOR

TECHNICAL FIELD

This disclosure in general relates to a transistor device, in particular a field-effect controlled transistor device with an insulated gate electrode.

BACKGROUND

Field-effect controlled transistor devices with an insulated gate electrode such as MOSFETs or IGBTs are widely used as electronic switches in automotive, industrial, household or consumer electronic applications. These transistor devices are available with voltage blocking capabilities of between several volts and several 100 volts, up to several kilovolts. A field-effect controlled transistor device with an insulated gate electrode includes a source region of a first doping type (conductivity type) in a body region of a second doping type complementary to the first doping type. A drift region of the first conductivity type adjoins the body region and is located between the body region and a drain region. The gate electrode is adjacent the body region, dielectrically insulated from the body region by a gate dielectric, and serves to control a conducting channel in the body region between the source region and the drift region. This type of transistor device is commonly referred to as MOS (Metal Oxide Semiconductor) transistor device although the gate electrode not necessarily includes a metal and the gate dielectric not necessarily includes an oxide.

In an MOS transistor device, the source region, the body region and the drift region form a parasitic (intrinsic) bipolar transistor, with the body region forming the base region of this bipolar transistor. This parasitic bipolar transistor may switch on under overload conditions. Examples of these overload conditions include an avalanche breakdown, cosmic radiation, overcurrent (a short circuit in a load connected in series with the MOS transistor), and commutation of a load connected to the MOS transistor. Switching on the parasitic bipolar transistor causes the MOS transistor to switch on, so that the MOS transistor switches on unintentionally and cannot be controlled by the gate electrode any more. Such switching on of the parasitic bipolar transistor is commonly referred to as latch-up and may lead to an irreversible destruction of the device, if the load (drain-source) current is not limited externally. Even if source and body regions of the MOS transistor are shorted by a metallization, a voltage drop in the body region, that is, between the base and the emitter of the bipolar transistor may occur and turn on the parasitic bipolar transistor.

There is therefore a need to produce a robust transistor device that is not prone to latch-up.

SUMMARY

A method includes forming a source region of a first doping type in a body region of a second doping type in a semiconductor body, and forming a low-resistance region of the second doping type adjoining the source region in the body region. Forming the source region includes a masked implanting of dopant particles of the first doping type via a first surface of the semiconductor body into the body region, and implanting the doping particles of the first doping type comprises a tilted implantation.

Another example relates to transistor device with at least one transistor cell. The at least one transistor cell includes, in a semiconductor body, a source region of a first doping type in a body region of a second doping type, a drain region, and a drift region of the first doping type adjoining the body region and arranged between the body region and the drain region; a low-resistance region of the second doping type in the body region and adjoining the source region; and a gate electrode dielectrically insulated from the source region and the body region by a gate dielectric and arranged above a first surface of the semiconductor body. A length of an overlap between the source region and the gate electrode is larger than 70 nanometers, and a doping profile of the low-resistance region along a line that is vertical to the first surface and goes through an edge of the gate electrode comprises a maximum of higher than $1E19 \text{ cm}^{-3}$.

Those skilled in the art will recognize additional features and advantages upon reading the following detailed description, and upon viewing the accompanying drawings.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
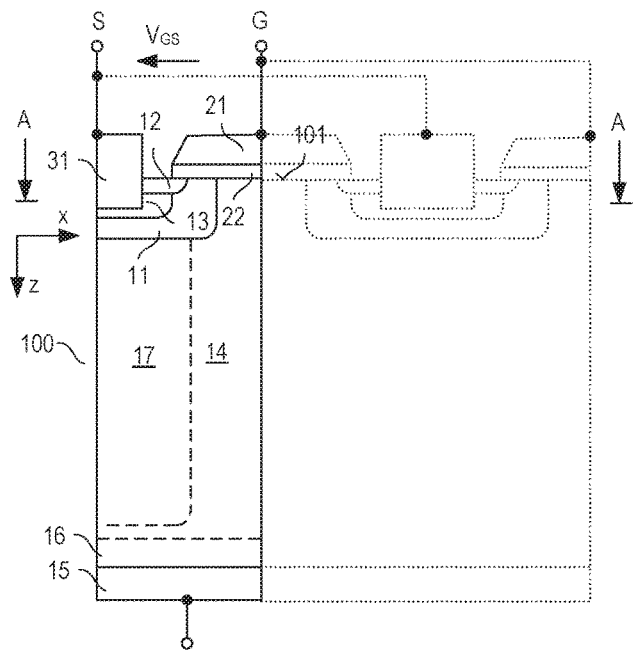
FIG. 1 shows a vertical cross sectional view of a section of a transistor device according to one example.

FIG. 1 shows a vertical cross sectional view of a transistor device and, more specifically, a field-effect controlled transistor device with an insulated gate electrode. The transistor device includes a semiconductor body 100, and active device regions in the semiconductor body 100. The semiconductor body 100 may include a conventional semiconductor material such as silicon (Si), silicon carbide (SiC), gallium arsenide (GaAs), gallium nitride (GaN), or the like. The active device regions include a source region 12, a body region 11, a drift region 14, and a drain region 15. For example, the source region 12 is of a first doping type (conductivity type), the body region 11 is of a second doping type (conductivity type) complementary to the first doping type, and the drift region 14 is of a first doping type. The body region 11 separates the source region 12 from the drift region 14. The drift region 14 adjoins the body region 11 and is arranged between the body region 11 and the drain region 15. The drift region 14 may adjoin the drain region 15. According to another example (illustrated in dashed lines in FIG. 1) a field-stop region 16 of the same doping type as the drift region 14, but with a different doping concentration, is arranged between the drift region 14 and the drain region 15.

Referring to FIG. 1, a gate electrode 21 is adjacent the body region 11 and dielectrically insulated from the body region 11 by a gate dielectric 22. In the example shown in FIG. 1, the dielectric and the gate electrode 21 are arranged on a first surface 101 of the semiconductor body 100 and, in a first lateral direction x of the semiconductor body 100, extend from the source region 12 along the body region 11 to a section of the drift region 14 that extends to the first surface 101. This type of gate electrode arranged on a surface of a semiconductor body is commonly referred to as planar gate electrode. The gate electrode 21 may include a conventional gate electrode material such as a metal or a highly doped polycrystalline semiconductor material, such as polysilicon. The gate dielectric 22 may include a conventional gate dielectric material, such as an oxide, a nitride, or combinations thereof.

The drain region 15 is electrically (ohmically) connected to the drain node D, the gate electrode 21 is electrically connected to a gate node G, and the source region 12 and the body region 11 are electrically connected to a source node S. The drain node D, the gate node G, and the source node S are only schematically illustrated in FIG. 1. The source region 12 and the body region 11 are electrically connected to the source node S through a source electrode 31.

The transistor device shown in FIG. 1 is a vertical transistor device. That is, the source region 12 and the drain region 15 are spaced apart from each other in a vertical direction z of the semiconductor body 100. The vertical direction z is a direction perpendicular to the first surface 101. The first lateral direction x, in which the source region 12 and a section of the drift region 14 are spaced apart from each other, is substantially parallel to the first surface 101.

Referring to FIG. 1, the transistor device further includes a low-resistance region 13 of the second doping type. This low-resistance region 13 is spaced apart from the first surface 101, adjoins the source region 12 in the vertical direction z, and, in the first lateral direction x, extends along a portion of the source region 12. This low-resistance region 13 furthermore adjoins the source electrode 31. The functionality of the low-resistance region 13 is explained with reference to FIG. 4 herein below.

The transistor device may include a plurality of identical transistor cells. In FIG. 1 only one such transistor cell is drawn in solid lines. Additional transistor cells are shown in dotted lines in FIG. 1. Each transistor cell includes a source region 12, a body region 11 and a low-resistance region 13, wherein two neighboring transistor cells may share one body region 11. The plurality of transistor cells may share the drift region 14, the drain region 15 and the optional field-stop region 16. The individual transistor cells are connected in parallel by having the source regions 12 and the body regions 11 connected to the source node S, and by having the gate electrodes 21 connected to the gate node G.

Optionally, the transistor device additionally includes a compensation region 17 (illustrated in dashed lines in FIG. 1) of the second doping type complementary to the first doping type. The compensation region 17 adjoins the drift region 14 and is connected to the source node S. In the example shown in FIG. 1, the compensation region 17 adjoins the body region 11 so that the compensation region 17 is connected to the source node S via the body region 11 and the low-resistance region 13. A transistor device with a compensation region, such as shown in FIG. 1, is commonly referred to as superjunction transistor device or compensation device.

Figure 2:
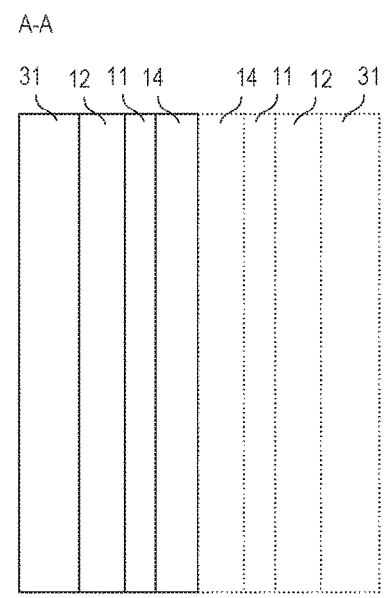
FIG. 2 shows a top view of a transistor device with stripe transistor cells.

FIG. 2 shows a horizontal cross sectional view according to one example of the transistor device shown in FIG. 1. A layout of this transistor device can be referred to as stripe layout. In this example, the at least one transistor cell is an elongated transistor cell (stripe cell), so that the source region 12 and the body region 11, in a second lateral direction y of the semiconductor body, are elongated device regions. The second lateral direction y is substantially perpendicular to the first lateral direction x explained with reference to FIG. 1. Consequently, in elongated transistor cells, the low-resistance region 13 is an elongated device region, and the gate electrode 21 (not shown in FIG. 2), in the second lateral direction y, extends along the source region 12 and the body region 11. The body regions 11 of several transistor cells are separated by the drift region 14.

Figure 3:
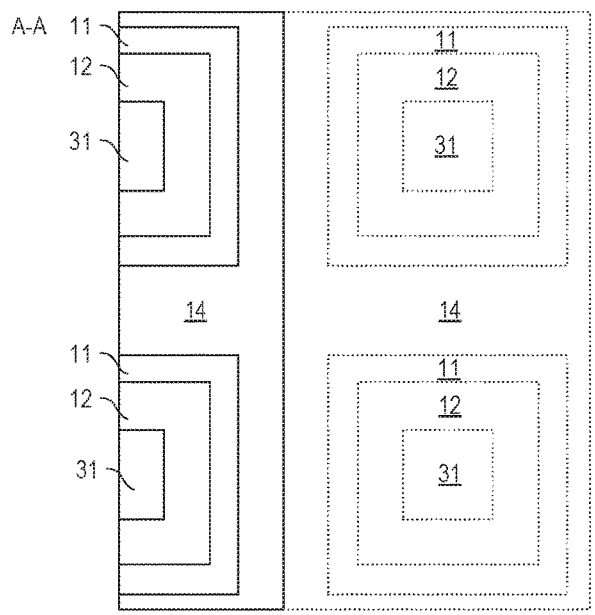
FIG. 3 shows a top view of a transistor device with polygonal transistor cells.

FIG. 3 shows a horizontal cross sectional view according to another example of the transistor device shown in FIG. 1. A layout of this transistor device can be referred to as polygonal layout. In this example, the at least one transistor cell is a polygonal transistor cell, so that the body region 11 is essentially polygonal and the source region 12 has the form of a polygonal ring of the same polygon type as the body region 11. The gate electrode 21 (not shown in FIG. 3) is a planar electrode with a polygonal opening of the same polygon type as the body region 11 above the body region 11. The body regions 11 of several transistor cells are separated by the drift region 14. In the example shown in FIG. 3, "polygonal" means "rectangular". This, however, is only an example. Other polygons such as, for example, pentagons, hexagons, or even circles may be used as well.

The transistor device can be implemented as an n-type transistor device or a p-type transistor device. The transistor device's type is defined by the doping type of the source region 12. In an n-type transistor device, the source region 12 and the drift region 14 are n-doped, while the body region 11 and the low-resistance region 13 are p-doped. In a p-type transistor device, the source region 12 and the drift region 14 are p-doped, while the body region 11 and the low-resistance region 13 are n-doped. Furthermore, the transistor device can be implemented as a MOSFET (Metal Oxide Semiconductor Field-Effect Transistor) or as an IGBT (Insulated Gate Bipolar Transistor). In a MOSFET, the drain region 15 has the same doping type as the source region 12, so that the drain region 15 is n-doped in an n-type transistor device, and p-doped in a p-type transistor device. In an IGBT, the drain region 15 has a doping type complementary to the doping type of the source region 12. In a Reverse Conducting (RC) IGBT the drain region may include emitter shorts of the same doping type as the drift region.

For example, a doping concentration of the source region 12 is selected from a range of between 1E18 cm$^{-3}$ and 1E21 cm$^{-3}$, a doping concentration of the drift region 14 is selected from a range of between 1E13 cm$^{-3}$ and 1E17 cm$^{-3}$, a doping concentration of the body region 11 is selected from a range of between 1E15 cm$^{-3}$ and 1E19 cm$^{-3}$, and a doping concentration of the drain region 15 is selected from the same range as the doping concentration of the source region 12.

The transistor device explained above is a voltage-controlled transistor device that switches on or off dependent on a voltage level of a voltage $V_{GS}$ between the gate node G and the source node S. This voltage $V_{GS}$ is referred to as gate-source voltage in the following. The transistor device switches on when the voltage level of the gate-source voltage $V_{GS}$ reaches a threshold level that causes the gate electrode 21, by field-effect, to generate an inversion channel in the body region 11 between the source region 12 and the drift region 14. The threshold level is referred to as threshold voltage $V_{th}$ in the following. When the transistor device switches on and a voltage is applied between the drain node D and the source node S, this inversion channel enables a current flow between the drain region 15 and the source region 12 or the drain node D and the source node S, respectively. The voltage between the drain node D and the source node S is referred to as drain-source voltage in the following.

Between the body region 11 and the drift region 14, and between the drift region 14 and the optional compensation region 17 the transistor device includes a pn junction. When the voltage level of the gate-source voltage $V_{GS}$ is below the threshold voltage $V_{th}$, so that there is no conducting channel in the body region 11, and a voltage is applied between the drain node D and the source node S that reverse biases the pn junction the transistor device is in the off-state. For example, an n-type transistor device is in the off-state if the gate-source voltage $V_{GS}$ is below the threshold voltage $V_{th}$ and the drain-source voltage is a positive voltage, that is, the drain node D has a higher electrical potential than the source node S. Under normal operation conditions, in the off-state of the transistor device, a voltage level of the drain-source voltage can increase up to the so-called voltage blocking capability. This voltage blocking capability is dependent on the specific design of the transistor device and can be up to several 100 volts (V), for example, 600V, 800V or 1200V.

Figure 4:
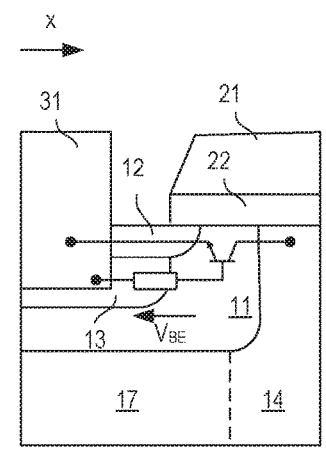
FIG. 4 shows a section of a transistor device of the type shown in FIG. 1 to illustrate the presence of an inherent bipolar junction transistor (BJT) in the transistor device.

By virtue of the source region 12 of the first doping type, the body region 11 of the second doping type and the drift region 14 of the first doping type, the transistor device inherently includes a bipolar junction transistor (BJT), which is usually referred to as inherent BJT or parasitic BJT. FIG. 4 shows an enlarged view of one transistor device where this BJT is shown. In particular, the circuit symbol of this BJT and its interconnection is shown in FIG. 4. Referring to FIG. 4, the body region 11 forms a base region of the BJT, the source region 12 forms the emitter region, and the drift region 14 forms the collector region of the BJT. Thus, the collector-emitter path of the BJT is connected between the drift region 14 and the source electrode 31. Via the low-resistance region 13, the base region of the BJT is also connected to the source electrode 31. The low-resistance region 13 forms an electrical resistance between the base region of the BJT and the source region 31. This resistance is represented by the circuit symbol of a resistor in FIG. 4. Just for the purpose of illustration, the BJT shown in FIG. 4 is drawn as an npn transistor. That is, it is assumed that the source region 12 and the drift region 14 are n-type regions, and the body region 11 and the low-resistance region 13 are p-type regions.

The transistor is in an off-state when there is a voltage between the drain node D and the source node S that reverse biases the pn junction between the drift region 14 and the body region 11, and the voltage level of the gate-source voltage $V_{GS}$ is below the threshold voltage $V_{th}$. In the off-state, the BJT may switch on when charge carrier pairs (electron-hole pairs) are generated in the drift region 14. For example, those charge carrier pairs can be generated when the transistor device undergoes electrical overstress (overload) conditions. Those overstress condition may include an avalanche breakdown caused by a drain-source voltage higher than the voltage blocking capability, commutation of an inductive load connected to the transistor device, a short circuit of a load connected to the transistor device, or cosmic radiation hitting the drift region.

For the purpose of explanation it is assumed that the transistor device is an n-type transistor device and a positive drain-source voltage is applied between the drain node D and the source node S, so that the electrical potential at the source electrode 31 is lower than the electrical potential at the drift region 14 and the drain region 15, respectively. In this case, from the charge carrier pairs generated in the drift region 14, electrons flow towards the drain region 15 and holes flow through the body region 11 and the low-resistance region 13 towards the source electrodes 31. By impact ionization, those charge carrier pairs may generate further charge carrier pairs so that a multiplication effect occurs. The charge carriers flowing from the body region 11 to the source electrode 31, which is also the emitter node of the BJT, cause a voltage drop between the body region 11, which is also the base region of the BJT, and the source electrode 31, which is also the emitter node of the BJT. This voltage drop is labeled $V_{BE}$ in FIG. 4. When a voltage level of this voltage reaches a threshold voltage of the BJT, the BJT switches on so that a current can flow between the source region 12 and the drift region 14 without the transistor device being controlled by the gate-source voltage $V_{GS}$. This is known as latch-up. By virtue of the current flowing through the BJT, the voltage between the body region 11 and the source electrode 31 is maintained above the threshold voltage of the BJT so that the BJT remains switched on as long as there is a voltage between the drain node D and the source node S. It is therefore desirable to increase the robustness of the BJT against such events. To "increase the robustness of the BJT" means to prevent the BJTs base-emitter voltage from getting higher than the BJTs threshold voltage. This includes optimizing the low-resistance region 13 located underneath the source region 12.

Figure 5A:
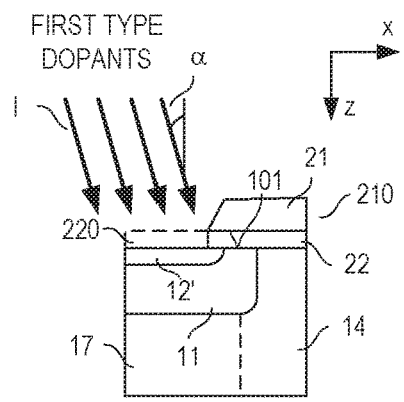
FIGS. 5A-5D illustrate one example of a method for forming a source region and a low-resistance region in a transistor device of the type shown in FIG. 1.
Figure 5B:
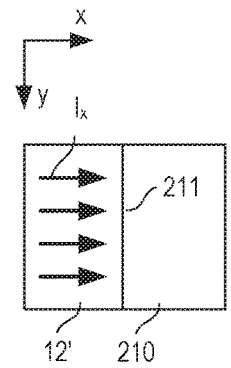
Figure 5C:
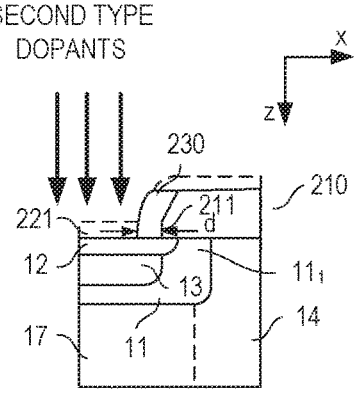
Figure 5D:
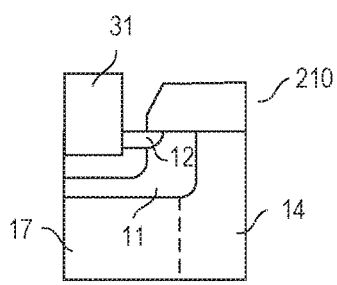

FIGS. 5A-5D show one example of a method for producing the source region 12 and the low-resistance region 13 such that the resulting intrinsic BJT has a high robustness. FIGS. 5A, 5C and 5D show, during different method steps, vertical cross sectional views of a section of one transistor cell that includes the body region 11, an adjoining section of the drift region 14, and an adjoining section of the optional compensation region 17. FIG. 5B shows a top view of the transistor cell.

Referring to FIG. 5A, the method includes implanting dopant particles of the first doping type via the first surface 101 into the body region 11. Implanting the dopant atoms includes using an implantation mask 210. The implantation mask 210 is arranged on the first surface 101, covers those sections of the drift region 14 extending to the first surface 101, and covers a portion of the body region 11. The implantation mask 210 may include the gate electrode 21 (as shown in Figure) or may be a mask that is removed later in the process. The latter is explained with reference to FIGS. 8A-8B below. Implanting the dopant particles of the first doping type includes a tilted implantation. A "tilted implantation" is an implantation in which a direction in which the dopant particles are implanted into the body region 11 is not perpendicular to the first surface 101 and, therefore, not parallel to the vertical direction z. Instead the implantation direction is inclined relative to the vertical direction z such that the dopant particles are partially implanted below the implantation mask 210 into the body region 11. According to one example, an angle $\alpha$ between the implantation direction and the vertical direction z is selected from a range of between 10° and 45°, in particular, between 20° and 40°. This angle can be referred to as tilt angle. An implantation vector I (shown in FIG. 5A) that defines the direction in which the dopant particles are implanted includes a vertical component parallel to the vertical direction z and a lateral component parallel to the first surface 101.

The lateral component $I_x$ of the implantation vector is shown in FIG. 5B, which shows a top view of the semiconductor body during implantation. According to one example, the lateral component $I_x$ of the implantation vector is perpendicular to an edge 211 of the gate electrode 210. Just for the purpose of explanation, this lateral component $I_x$ is parallel to the first lateral direction x in the example shown in FIG. 5B. Optionally, a scattering layer 220, such as an oxide layer, is formed on the first surface 101 before the implantation process so that the dopant particles are implanted through the scattering layer 220 into the body region 11.

In FIG. 5A, reference character 12' denotes a region into which the dopant particles of the first doping type are implanted. Besides implanting the dopant particles forming the source region 12 includes an annealing process that electrically activates the implanted dopant particles. For example, a temperature in this annealing process is selected from a range of between 850° C. and 950° C., and a duration is selected from a range of between 30 minutes and 2 hours. According to one example, the annealing process that activates the dopant atoms of the source region 12 is additionally to a previous annealing process that activates the dopant atoms of the body region 11. Forming the body region 11 before forming the source region 12 may include implanting dopant atoms using the same implantation mask 210 as shown in FIG. 5A, and an annealing process. This annealing process is chosen such that it activates the implanted dopant atoms but also diffuses the dopant atoms in a lateral direction below the implantation mask 210.

Referring to FIG. 5C, the method further includes forming the low-resistance region 13 underneath the source region 12, as seen from the first surface 101. Forming the low-resistance region 13 includes implanting dopant particles of the second doping type via the first surface 101 into the body region 11. Implanting these dopant particles of the second dopant type includes using the implantation mask 210 and a spacer 230 formed at least on a sidewall of the implantation mask 210. In FIG. 5C, d denotes a thickness of the spacer 130 in a region adjoining the first surface 101 or the scattering layer 221, respectively. For example, the spacer thickness is selected from a range of between 100 nanometers and 500 nanometers, in particular a range of between 200 nanometers and 400 nanometers.

An implantation energy in this implantation process is selected such that the doping particles of the second doping type are implanted deeper into the semiconductor body 100 than the dopant particles of the first doping type. Besides implanting the dopant particles forming the low-resistance region 13 includes an annealing process that electrically activates the implanted dopant particles. For example, a temperature in this annealing process is selected from a range of between 850° C. and 950° C., and a duration is selected from a range of between 30 minutes and 2 hours. This annealing process is additional to the annealing process mentioned above that activates the dopant atoms of the source region 12.

For example, the dopant particles of the first doping type that form the source region 12 include at least one of arsenic ions and phosphorous ions, and an implantation energy may be selected from a range of between 60 keV and 180 keV. The dopant particles of the second doping type that form the low-resistance region may include boron ions. According to one example, the implantation energy of the second type doping particle is selected such that these doping particles are implanted 150 nm deeper than the first doping type particles, but not more than 500 nm deeper than first doping type particles.

Referring to FIG. 5D, the method further includes forming the source electrode 31 that contacts the source region 12 and the low-resistance region 13. Forming the source electrode 31 may include etching a trench into the first surface 101 and forming the source electrode 31 in this trench. The source electrode 31 may include a conventional source electrode material such as, for example, a metal or a highly doped polycrystalline semiconductor material such as polysilicon.

The spacer 230 shown in FIG. 5C prevents the dopant particles of the second doping type from being implanted into the body region 11 too close to the edge 211 of the implantation mask. The reason for using such spacer 230 is explained in further detail herein below. Various types of spacers can be used. FIGS. 6A-6B and 7A-7B show two different methods of how the spacer 230 can be produced.

Figure 6A:
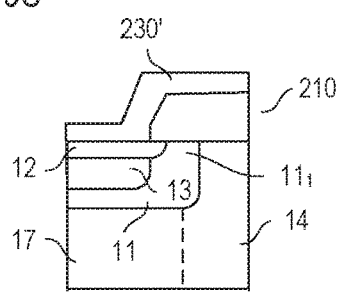
FIGS. 6A-6B illustrate a method for forming a spacer shown in FIG. 5C according to one example.
Figure 6B:
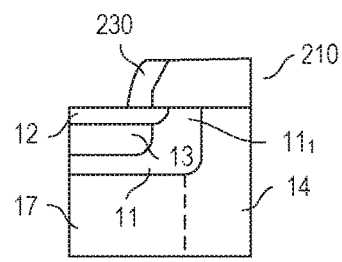

According to one example shown in FIGS. 6A-6B, forming the spacer 230 includes forming a layer 230' on the first surface 101 of the semiconductor body 100 and the implantation mask 210, and etching this layer 230' so as to maintain the layer 230' only along the edge 211 of the implantation mask 210 where it forms the spacer. For example, layer 230' is an oxide layer and forming the layer 230' includes one of a thermal oxidation and a deposition process. For example, the etching process is an anisotropic etching process. A spacer 230 formed in this process can be referred to as oxide spacer.

Figure 7A:
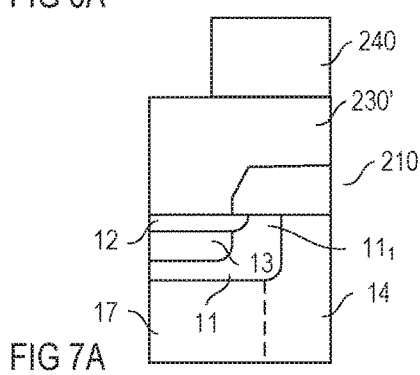
FIGS. 7A-7B illustrate a method for forming a spacer shown in FIG. 5C according to another example.
Figure 7B:
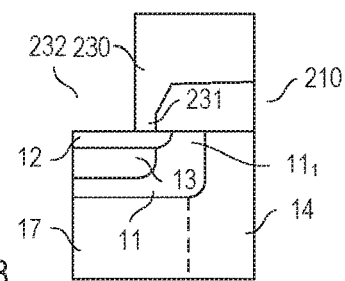

According to another example shown in FIGS. 7A-7B, forming the spacer 230 includes forming a resist layer 230' on the first surface 101 of the semiconductor body 100 and the implantation mask 210, and structuring the resist layer 230' such that there is an opening 232 in the resist layer spaced apart from the edge 211 of the implantation mask 210. A region of the resist layer 230 between the opening and the edge of the implantation mask 210 forms the spacer 231. Forming the opening in the resist layer 230 may include a conventional process in which the resist layer is selectively exposed to light using a mask 240, developed, and etched. A spacer 230 formed in this process can be referred to as resist spacer.

Referring to FIG. 5A and as explained above, the implantation mask 210 may include the gate electrode 21 and the gate dielectric 22. Optionally, an insulation layer, such as an oxide layer can be formed on the gate electrode 21 before the implantation process. However, such insulation layer is not shown in FIG. 5A. If there is such insulation layer, the spacer 230 shown in FIG. 5C is formed on such insulation layer.

Figure 8A:
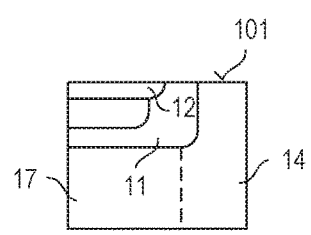
FIGS. 8A-8B illustrate a modification of the method shown in FIGS. 5A-5D.
Figure 8B:
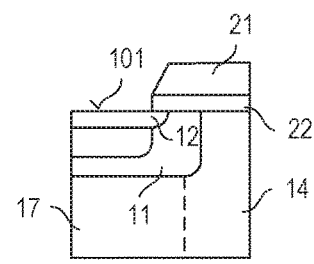

According to another example, shown in FIGS. 8A-8B, the gate electrode 21 and the gate dielectric 22 are formed after the implantation processes explained with reference to FIGS. 5A and 5C. In this case, as shown in FIG. 6A, the implantation mask 210 is removed after these implantation processes. The gate dielectric 22 and the gate electrode 21 are then formed on those regions of the first surface 101 that were formerly covered by the implantation mask 210. The transistor cell after forming the gate electrode 21 and the gate dielectric 22 is shown in FIG. 8B. In general, the implantation mask 210 used in the implantation processes can be any type of structured layer or layer arrangement that is suitable to prevent ions from being implanted into those regions of the semiconductor body 100 covered by the implantation mask, while making it possible for ions to be implanted into those regions not covered by the implantation mask. For example, the implantation mask 610 shown in FIG. 6A, which is not the gate electrode can be a hard mask or any other type of implantation mask.

FIGS. 5A and 5B show only one implantation process for forming the source region 12. As explained, in this implantation process a lateral component $I_x$ of the implantation vector I is substantially perpendicular to the edge 211 of the implantation mask 210. By this, some of the dopant atoms are implanted into the body region 11 below the implantation mask along the edge 211. Although only one implantation process is shown in FIGS. 5A and 5B forming the source region 12 may include two or more tilted implantation processes, wherein this number is dependent on the specific type or layout of the transistor cell.

Figure 9A:
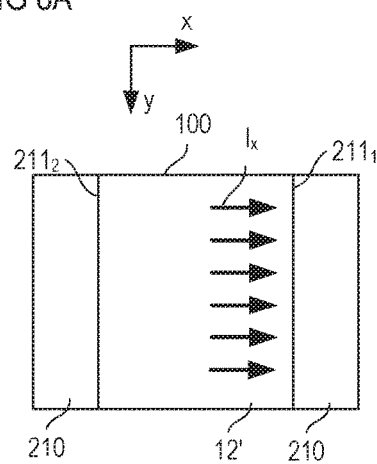
FIGS. 9A-9B illustrates a two-fold (dual mode) implantation process for forming the source region.
Figure 9B:
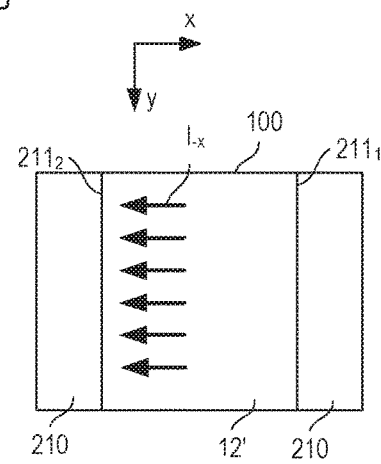
Figure 10A:
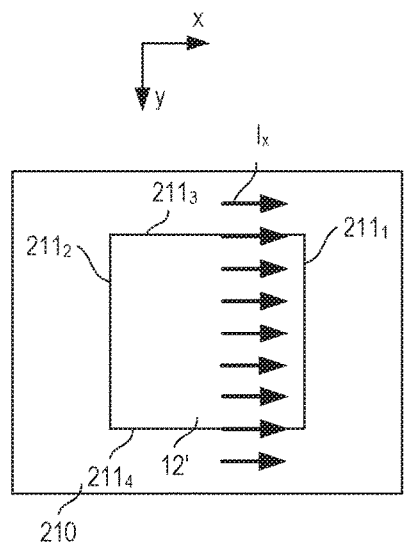
FIGS. 10A-10D illustrates a four-fold (quad mode) implantation process for forming the source region.
Figure 10B:
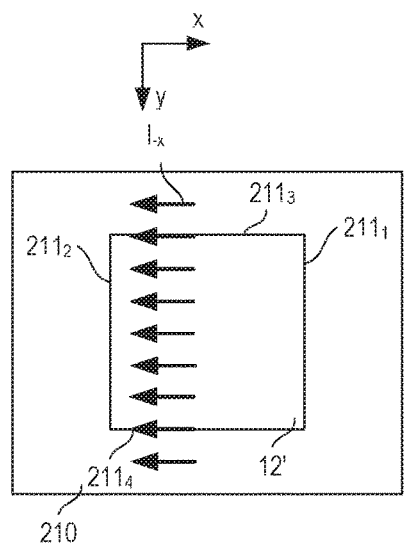
Figure 10C:
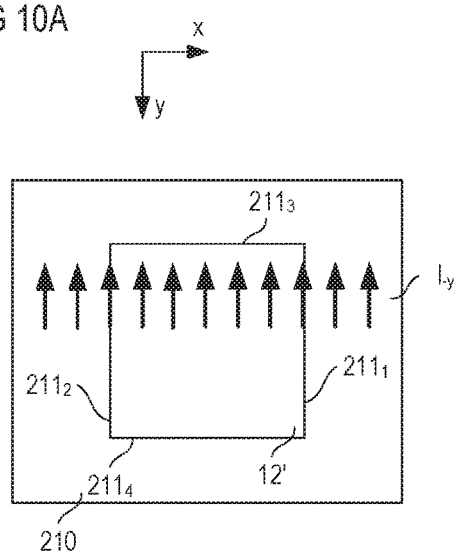
Figure 10D:
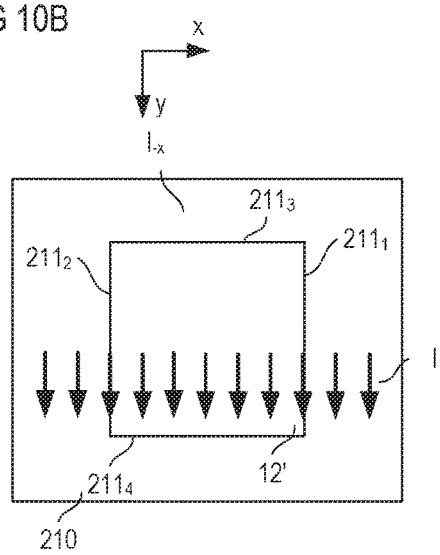

Referring to FIGS. 9A-9B, which show top views of one section of the semiconductor body 100, forming the source region in a stripe cell may include a two-fold (dual mode) tilted implantation process. In this case, the implantation mask 210 defines an elongated opening above the body region 11, and includes two elongated and essentially parallel edges $211_1$, $211_2$. In a first tilted implantation, shown in FIG. 9A, the implantation vector is such that the lateral component $I_x$ is essentially perpendicular to the first edge $211_1$ and is directed towards the first edge $211_1$, so as to implant dopant atoms into the body region 11 below the first edge $211_1$. In a second tilted implantation, shown in FIG. 9B, the implantation vector is such that the lateral component $I_{-x}$ is essentially perpendicular to the second edge $211_2$ and is directed towards the second edge $211_2$, so as to implant dopant atoms into the body region 11 below the second edge $211_2$.

Referring to FIGS. 10A-10D, which show top views of one section of the semiconductor body 100, forming the source region in a polygonal cell may include more than two tilted implantations, wherein the number of implantations is defined by the polygonal form of the transistor cell and, more specifically, the number of sides the polygon has. The implantation mask 210 includes an opening that defines the polygonal shape of the source region (and the body region, if the same mask is used for forming both the body region and the source region). If the polygon is a rectangle the implantation mask includes a rectangular opening with four edges $211_1$, $211_2$, $211_3$, and $211_4$, as shown in FIGS. 10A-10D. In order to implant dopant atoms into the body region 11 below each of these edges $211_1$-$211_4$ the implantation process includes four tilted implantations. In a first tilted implantation, shown in FIG. 10A, the implantation vector is such that the lateral component $I_{-x}$ is essentially perpendicular to a first edge $211_1$ and is directed towards the first edge $211_1$; in a second tilted implantation, shown in FIG. 10B, the implantation vector is such that the lateral component $I_x$ is essentially perpendicular to a second edge $211_2$ and is directed towards the second edge $211_2$; in a third tilted implantation, shown in FIG. 10C, the implantation vector is such that the lateral component $I_{-y}$ is essentially perpendicular to a third edge $211_3$ and is directed towards the third edge $211_3$; and in a fourth tilted implantation, shown in FIG. 10D, the implantation vector is such that the lateral component $I_y$ is essentially perpendicular to a fourth edge $211_4$ and is directed towards the fourth edge $211_4$. Forming the source region 12 in a hexagonal transistor cell may include six tilted implantations, and so on.

Forming the source region 12 and the low-resistance region 13 by the method explained with reference to FIGS. 5A-5D results in a well-defined threshold voltage of the transistor device and a robust bipolar junction transistor. This is explained with reference to FIGS. 11 and 12 below.

Figure 11:
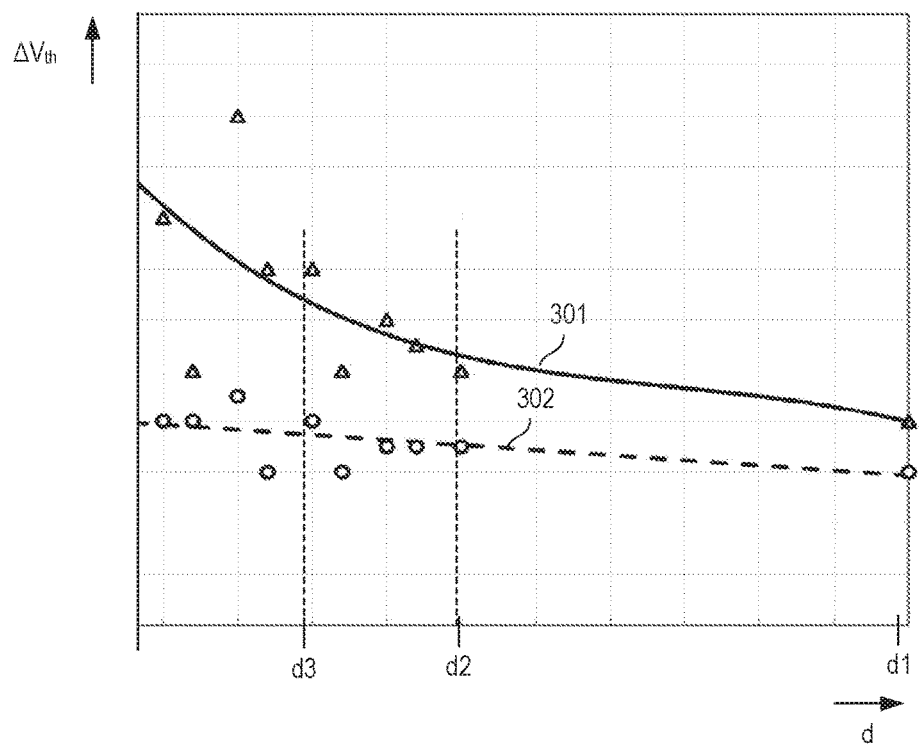
FIG. 11 illustrates a variation of a threshold voltage of a transistor device produced in accordance with the method shown in FIGS. 5A-5D, and of a transistor device produced in accordance with a conventional method.

FIG. 11 is based on parameters of a plurality of sample transistors produced according to a conventional method, and a plurality of sample transistor devices produced in accordance with the method shown in FIGS. 5A-5D. The method according to FIGS. 5A-5D is referred to as "tilted implantation process" in the following. The "conventional method" is different from the method shown in FIGS. 5A-5D in that the dopant particles of the first doping type that form the source region are implanted at zero tilt, that is, at $\alpha=0$. The samples produced according to the tilted implantation process were produced using the same tilt angle. Specifically, the tilt angle in this example was $\alpha=30°$. The other parameters, such as the doping concentration of the body region 11 and the drift region 14, and implantation doses and implantation energies in the implantation processes for producing the source region 12 and the low-resistance region 13 were the same in the conventional method and in the tilted implantation process.

The parameter that was varied in the tilted implantation process and the conventional process was the thickness d of the spacer. At each of a plurality of different spacer thicknesses d a plurality of transistor devices were produced in accordance with the tilted implantation process and the conventional process. The threshold voltage of each transistor was measured. For each group of transistors produced under same conditions a difference $\Delta V_{th}=V_{th\text{-}max}-V_{th\text{-}min}$ between a maximum threshold voltage $V_{th\text{-}max}$ and a minimum threshold voltage $V_{th\text{-}min}$ was calculated. This difference is referred to as variation of the threshold voltage in the following. A "group of transistors produced under same conditions" is a group of transistors produced at the same thickness and at the same source implantation type, that is, either the tilted implantation process or the conventional process. Curve 301 in FIG. 11 represents the variation of the threshold voltage over the thickness d of the samples produced in accordance with the conventional method, and curve 302 represents the variation of the threshold voltage over the thickness d of the samples produced in accordance with the tilted implantation method.

To obtain the curves shown in FIG. 11 sample transistor devices were produced using n=10 different thicknesses d of the spacer 230. The triangle symbols shown in FIG. 11 illustrate the variation $\Delta V_{th}$ of the threshold voltage obtained for the samples processed in accordance with the conventional method, and the circle symbols shown in FIG. 11 illustrate the variation $\Delta V_{th}$ of the threshold voltage obtained for the samples processed in accordance with the tilted implantation method. Curve 301 is a trend line calculated based on the values represented by the triangle symbols shown in FIG. 11, and curve 302 is a trend line calculated based on the values represented by the circle symbols shown in FIG. 11. In the illustrations shown in FIG. 11, the thickness d increases from left to right on the d-axis, so that, d1>d2>d3. For example, d1=500 nanometers (nm), d2=350 nm, and d3=300 nm.

As can be seen from curve 301 in FIG. 11, in the conventional method a variation $\Delta V_{th}$ of the threshold voltage increases as the thickness d of the spacer d decreases. This can be explained with reference to FIG. 5C, which shows implanting the dopant particles of the second doping type using the implantation mask 230. These dopant particles of the second doping type are implanted at a higher energy than the dopant particles of the first doping type. In this implantation process, dopant particles do not only move in the vertical direction z of the body region 11 but, due to collisions with atoms in the crystal lattice of the semiconductor body 100, also move in the first lateral direction x. Basically, the distance the dopant particles of the second doping type may move in the lateral direction x, increases as the implantation energy increases. If the dopant particles of the second doping type would be implanted using only the implantation mask 210 without the spacer 230, the dopant particles of the second doping type, in the lateral direction x, would travel farther below the implantation mask 210 than the doping particles of the first doping type. This is because the doping particles of the first doping type are implanted at a lower implantation energy than the particles of the second doping type. An implantation process without spacer would therefore result in a significant amount of doping particles of the second doping type in a section $11_1$ (see FIG. 5C) of the body region 11. This section $11_1$ of the body region 11 is a section between the source region 12 and the drift region 14. If dopant particles of the second implantation process end up in this section $11_1$ they affect the threshold voltage $V_{th}$. Thus, variations of the spacer thickness d, which may result from inevitable process variations in the manufacturing process, may result in significant variations of the threshold voltage $V_{th}$. In particular, as can be seen from curve 301 in FIG. 11 the variation $\Delta V_{th}$ of the threshold voltage increases as the thickness d decreases. This is because a relative small variation of the spacer thickness d has a large impact on threshold voltage for small values of d. For large d this variation (e.g. due to an overlay error in the process) does not affect the threshold voltage Vth much so that a resulting variation $\Delta V_{th}$ is governed by other process tolerances than the thickness d of the spacer.

As can be seen from curve 301 in FIG. 11, as the spacer thickness d decreases an increase of the variation $\Delta V_{th}$ of the threshold voltage $V_{th}$ is smaller than in the conventional method. Even at low spacer thicknesses d, the variation $\Delta V_{th}$ of the threshold voltage $V_{th}$ is lower in the semiconductor devices resulting from the tilted implantation process than in the devices resulting from the conventional process. A possible explanation for this is that by the tilted implantation more dopant particles of the first doping type end up below the gate electrode 21, whereas the dopant particles of the second doping type not necessarily move farther in the lateral direction x than in the conventional method. However, the higher amount of dopant particles of the first doping type below the gate electrode 21 has a kind of gettering effect that getters dopant particles of the second doping type which, otherwise, may end up in the section $11_1$ where they could affect the threshold voltage $V_{th}$. Thus, even at the same spacer thickness d than in the conventional method less dopant particles of the second doping type end up in region $11_1$ of the body region. As can be seen from FIG. 1, reducing the thickness d in a certain range between d2 and d1 does not significantly influence the variation $\Delta V_{th}$ of the threshold voltage. Thus, the method is robust against variations of this thickness d in the manufacturing process.

Figure 12:
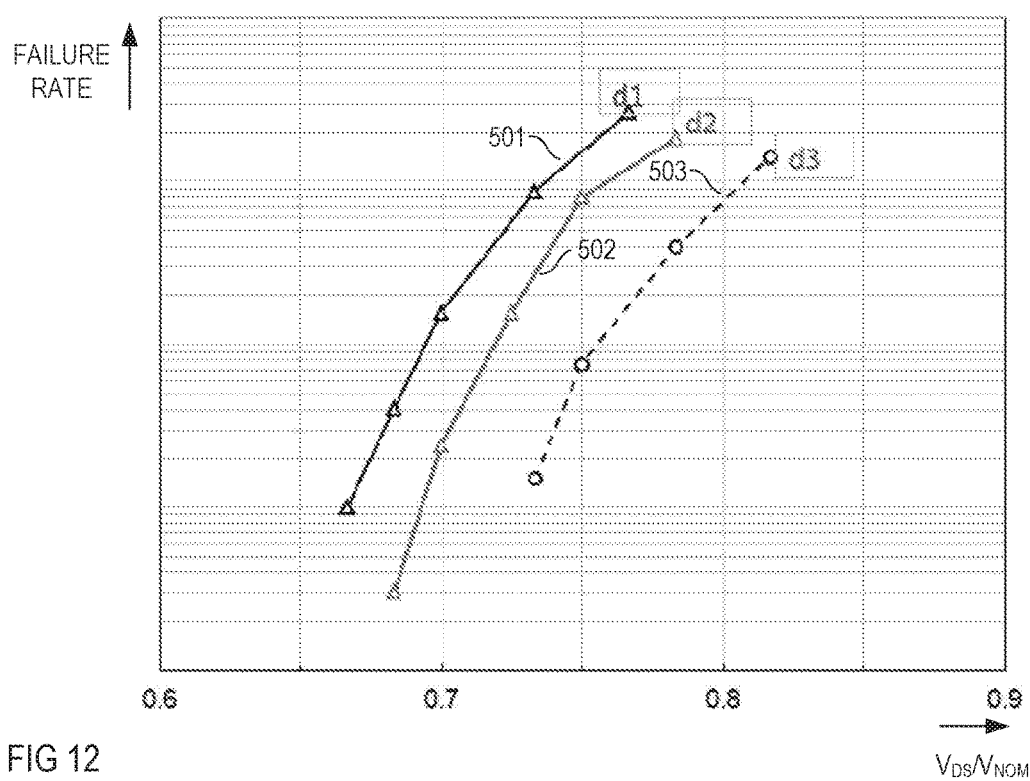
FIG. 12 illustrates a robustness of the inherent bipolar junction transistor in transistor devices produced with different spacer thicknesses.

Furthermore, referring to FIG. 12, the robustness of the BJT increases as the thickness d decreases. As the thickness d decreases, a total length of the low-resistance region 13 along the source region 12 increases. The farther this low-resistance region 13 extends along the source region 12, the lower is the resistance represented by the resistor in FIG. 4, and the more robust the device is against events that may cause the generation of charge carrier pairs in the body region 11. The robustness of the BJT was evaluated by evaluating a plurality of sample transistor devices. Specifically, two groups of sample transistor devices were produced according to the standard implantation method, a first group at a spacer thickness d1, and a second group at a larger spacer thickness d2. A third group was produced according to the tilted implantation method at a spacer thickness d3, wherein d1>d2>d3. The variation $\Delta V_{th}$ of the threshold voltage of these sample transistor devices is shown in FIG. 11. The sample transistor devices were evaluated by operating them in the off-state, applying a drain-source voltage between the drain node D and the source node S, by irradiating particles into the device that were suitable to generate charge carrier pairs, and by determining a failure rate. According to one example, the particles are protons. FIG. 12 shows the failure rate over a normalized drain-source voltage $V_{DS}/V_{NOM}$, where $V_{DS}$ is that drain-source voltage at which a failure occurs and $V_{NOM}$ is the rated voltage blocking capability.

As can be seen from FIG. 12, in each group, the failure rate increases as the drain-source voltage increases. Furthermore, at a given drain-source voltage $V_{DS}$, the smaller the spacer thickness the lower is the failure rate. Thus, by reducing the spacer thickness in the tilted manufacturing process the BJT's robustness can be increased. However, as can be seen from FIG. 11, such reduction does not increase the variation of the threshold voltage.

Figure 13:
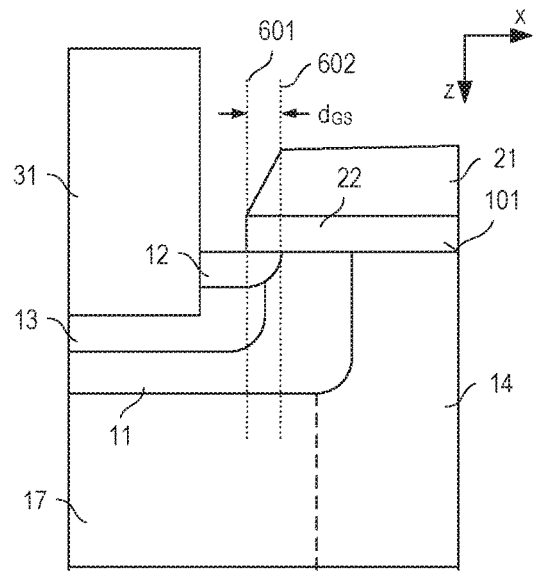
FIG. 13 is an enlarged view of one section of the transistor device.

By the tilted implantation method the source region 12 can be produced to overlap the gate electrode 21 more than by the conventional method. This is explained with reference to FIG. 13, which shows an enlarged view of the gate electrode 21, the gate dielectric 22, the source region 12, the body region 11, and the low-resistance region 13. The overlap between the source region 12 and the gate electrode 21 is a measure of how far in the lateral direction x the source region 11 extends below the gate electrode 21. Referring to FIG. 13, such overlap can be defined as a distance dos along the first surface 101 between the pn-junction and an edge of the gate electrode 21. In FIG. 13, vertical line 601 indicates a horizontal position of the edge of the gate electrode 21, and vertical line 602 indicates the horizontal position of the pn-junction. The "pn-junction" is the pn-junction between the source region 12 and the body region 11 and the low-resistance region, respectively. At the pn-junction, a doping concentration of the first type dopants (the dopants of the source region 11) essentially equals a doping concentration of the second type dopants (the dopants of the body region 12 and the low-resistance region 13). The "edge" of the gate electrode 21 terminates the edge electrode in the lateral direction x (with other words, the edge is that portion of the gate electrode 21 that, in the lateral direction, is closest to the source electrode 31). The overlap $d_{GS}$ is the distance between vertical lines 601 and 602.

Basically, the overlap $d_{GS}$ increases as the tilt angle increases. According to one example, the overlap is larger than 70 nanometers (nm) or even larger than 100 nanometers (nm). By virtue of this larger overlap dos, as compared to the conventional method, the low-resistance region 13 can be produced with a higher doping concentration directly below the edge of the gate electrode 21 than in the conventional method, without degrading the threshold voltage stability. This high doping concentration of the low-resistance region 13 below the gate electrode increase the BJT's robustness. According to one example, at least one portion of the low-resistance region 13 below the edge of the gate electrode 21 has a doping concentration of higher than 1E19 $cm^{-3}$, in particular higher than 3E19 $cm^{-3}$. That is, a doping profile taken along line 601 in the low-resistance region 13 has a maximum doping concentration of higher than 1E19 $cm^{-3}$.

Figure 14A:
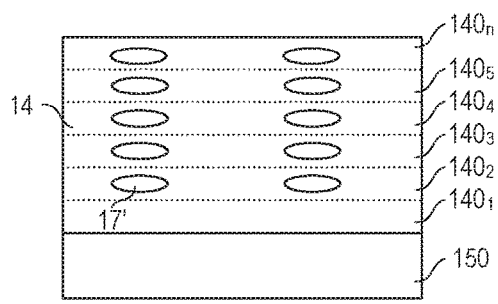
FIGS. 14A-14B illustrate one example of a method for producing compensation regions in the semiconductor body used in the method shown in FIGS. 5A-5D.
Figure 14B:
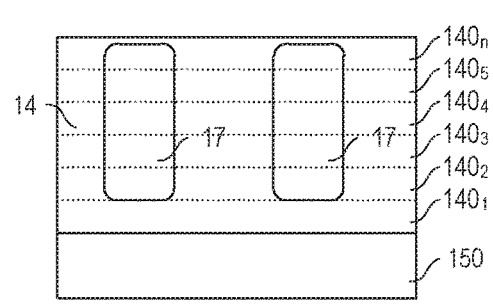

The semiconductor body underlying the method shown in FIGS. 5A-5D can be produced in a conventional way. One method for producing the semiconductor body 100 with a plurality of compensation regions 17 is shown in FIGS. 14A-14B. Referring to FIG. 14A, the method may include providing a substrate 150 and forming a plurality of epitaxial layers $140_1$-$140_n$ on the substrate 150. In each epitaxial layer, dopant particles of the second doping type can be implanted and/or diffused. Regions in which these dopant particles are implanted, are labelled with 17' in FIG. 14A. In an annealing process, the doping particles implanted into the epitaxial layers $140_1$-$140_n$ diffuse deeper into the epitaxial layers to form a continuous compensation region 17. The epitaxial layers $140_1$-$140_n$ can be produced with a basic doping which corresponds to the doping concentration of the drift region 14 in the finished transistor device, and the semiconductor substrate 150 may form the drain region 15 in the finished transistor device. The body regions 11 may be formed in an implantation and/or diffusion process after forming the compensation regions 17.

Figure 15A:
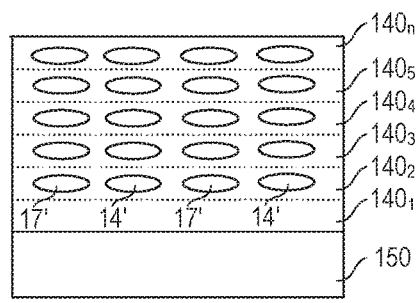
FIGS. 15A-15B illustrate another example of a method for producing compensation regions the semiconductor body used in the method shown in FIGS. 5A-5D.
Figure 15B:
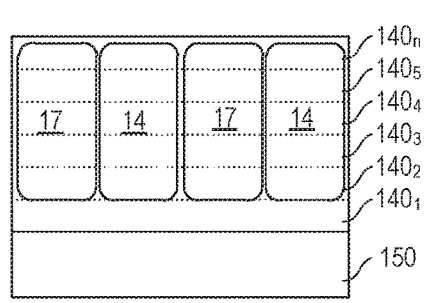

FIGS. 15A-15B show another method for producing the semiconductor body 100 with a plurality of compensation regions 17. The method shown in FIGS. 15A-15B is different from the method shown in FIGS. 14A-14B in that the epitaxial layers $140_1$-$140_n$ are undoped (non-doped, intrinsic) layers and that besides the dopant particles of the second doping type dopant particles of the first doping are implanted. Regions into which dopant particles of the first doping type were implanted are labelled with 14' in FIG. 15A. In the annealing process explained above, the doping particles of the first doping type and the doping particles of the second doping diffuse deeper into the epitaxial layers, wherein the doping particles of the second doping type form continuous compensation regions 17, and the doping particles of the first doping type form continuous drift regions 14 adjacent the compensation regions 17. According to one example, in a lowermost epitaxial layer, which is the layer $140_1$ adjoining the substrate no compensation regions are formed. In this case, this lowermost layer $140_1$ may be formed with a basic doping of the first doping type so that this layer $140_1$ forms a portion of the drift region 14 in the finished device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
   forming a drain region at a first side of a semiconductor body;
   forming a drift region of a first doping type above the drain region in the semiconductor body;
   forming a body region of a second doping type above the drift region in the semiconductor body;
   forming a source region of the first doping type in the body region at a second side of the semiconductor body opposite the first side; and
   forming a low-resistance region of the second doping type adjoining the source region in the body region,
   wherein forming the source region comprises implanting dopant particles of the first doping type using an implantation mask via a first surface of the semiconductor body into the body region,
   wherein implanting the doping particles of the first doping type comprises a tilted implantation,
   wherein forming the low-resistance region comprises implanting dopant particles of the second doping type using the implantation mask,
   wherein the method further comprises:
   forming a spacer on at least one sidewall of the implantation mask; and
   after forming the spacer, implanting dopant particles of the second doping type into the first surface of the semiconductor body to form the low-resistance region of the second doping type in the body region, the spacer preventing the dopant particles of the second doping type from being implanted into the body region in close proximity to an edge of the implantation mask covered by the spacer.

2. The method of claim 1, wherein forming the source region further comprises:
   performing a first annealing process after implanting the dopant particles of the first doping type and before implanting the dopant particles of the second doping type.

3. The method of claim 2, wherein a temperature of the first annealing process is in a range between 850° C. and 950° C.

4. The method of claim 1, wherein forming the low-resistance region further comprises a second annealing process after implanting the dopant particles of the second doping type.

5. The method of claim 4, wherein a temperature of the second annealing process is in a range between 850° C. and 950° C.

6. The method of claim 1, wherein the tilted implantation has a tilt angle of between 10° and 45° relative to a vertical direction of the semiconductor body.

7. The method of claim 6, wherein the tilt angle is between 20° and 40° relative to a vertical direction of the semiconductor body.

8. The method of claim 1,
wherein implanting the doping particles of the first doping type comprises at least two tilted implantations,
wherein each of the at least two tilted implantations comprises an implantation vector with a lateral component, and
wherein the lateral components associated with the implantation vectors of the at least two tilted implantations are different from each other.

9. The method of claim 1, wherein implanting the doping particles of the first doping type comprises two tilted implantations.

10. The method of claim 1, wherein implanting the doping particles of the first doping type comprises four tilted implantations.

11. The method of claim 1, wherein a thickness of the spacer is in a range between 100 nanometers and 500 nanometers.

12. The method of claim 1, wherein a thickness of the spacer is in a range between 200 nanometers and 400 nanometers.

13. The method of claim 1, wherein the implantation mask comprises a gate electrode and a gate dielectric arranged between the gate electrode and the semiconductor body.

14. The method of claim 1, further comprising:
removing the implantation mask; and
forming a gate dielectric on the body region and a gate electrode on the gate dielectric.

15. The method of claim 1, wherein the drain region is of one of the first doping type and the second doping type.

16. The method of claim 1, wherein the semiconductor body further comprises a compensation region of the second doping type adjoining the body region and the drift region.

17. The method of claim 1, wherein forming the spacer comprises:
forming a layer on the first surface of the semiconductor body and the implantation mask; and
etching the layer so as to maintain the layer only along the edge of the implantation mask where it forms the spacer.

18. The method of claim 17, wherein the layer is an oxide layer and wherein forming the layer comprises one of a thermal oxidation and a deposition process.

19. The method of claim 1, wherein forming the spacer comprises:
forming a resist layer on the first surface of the semiconductor body and the implantation mask; and
structuring the resist layer to form an opening in the resist layer spaced apart from the edge of the implantation mask, wherein a region of the resist layer between the opening and the edge of the implantation mask forms the spacer.

20. The method of claim 1, further comprising:
forming a scattering layer on the first surface of the semiconductor body; and
after forming the scattering layer, implanting dopant particles of the second doping type through the scattering layer and into the first surface of the semiconductor body to form the low-resistance region of the second doping type in the body region.

* * * * *